(12) United States Patent
Loew et al.

(10) Patent No.: US 10,884,079 B2
(45) Date of Patent: Jan. 5, 2021

(54) ASYMMETRIC BIRDCAGE COIL FOR A MAGNETIC RESONANCE IMAGING (MRI)

(71) Applicant: Children's Hospital Medical Center, Cincinnati, OH (US)

(72) Inventors: Wolfgang Manfred Loew, Cincinnati, OH (US); Charles Lucian Dumoulin, Cincinnati, OH (US)

(73) Assignee: Children's Hospital Medical Center, Cincinnati, OH (US)

( * ) Notice: Subject to any disclaimer, the term of this patent is extended or adjusted under 35 U.S.C. 154(b) by 0 days.

(21) Appl. No.: 16/437,234

(22) Filed: Jun. 11, 2019

(65) Prior Publication Data
US 2019/0377039 A1 Dec. 12, 2019

Related U.S. Application Data

(60) Provisional application No. 62/683,252, filed on Jun. 11, 2018.

(51) Int. Cl.
*G01R 33/34* (2006.01)
*G01R 33/36* (2006.01)

(52) U.S. Cl.
CPC ... *G01R 33/34076* (2013.01); *G01R 33/3657* (2013.01)

(58) Field of Classification Search
CPC .......... G01R 33/34076; G01R 33/3657; G01R 33/5659; G01R 33/422
See application file for complete search history.

(56) References Cited

U.S. PATENT DOCUMENTS

| 4,591,818 | A  | 5/1986  | Butson |
| 7,292,038 | B2 | 11/2007 | Doty |
| 7,345,481 | B2 | 3/2008  | Leussler |
| 8,013,609 | B2 | 9/2011  | Vartiovaara |
| 8,947,084 | B2 | 2/2015  | Habara et al. |

(Continued)

FOREIGN PATENT DOCUMENTS

| CN | 106980097 A | * | 7/2017 |
| CN | 206930769 U | * | 1/2018 |

OTHER PUBLICATIONS

Walkup et al.; "Translational applications of hyperpolarized 3He and 129Xe"; NMR in Biomedicine; vol. 27, Dec. 2014; p. 1429-1438 (abstract only).

(Continued)

*Primary Examiner* — Susan S Lee
(74) *Attorney, Agent, or Firm* — BakerHostetler

(57) ABSTRACT

A birdcage coil for a magnetic resonance imaging (MRI) system is provided. The birdcage coil includes: (a) a pair of conductive end rings, each having a generally domed shape in axial cross section; (b) a plurality of conductive, elongated rungs extending between the pair of conductive end rings in an axial direction; and (c) an LC delay circuit incorporated into the pair of rings and the plurality of elongated rungs, where the LC delay circuit includes a plurality of capacitive elements and a plurality of inductive elements. In the present invention circumferential spacing between adjacent elongated rungs is varied to improve homogeneity of the volume excitation. Alternatively, or in addition, LC circuit capacitance and/or inductance values are varied to improve homogeneity of the volume excitation.

26 Claims, 12 Drawing Sheets

(56) References Cited

U.S. PATENT DOCUMENTS

| | | | |
|---|---|---|---|
| 9,638,771 B2 | 5/2017 | Soutome et al. | |
| 2009/0192382 A1* | 7/2009 | Nistler | G01R 33/3415 |
| | | | 600/410 |
| 2012/0025833 A1* | 2/2012 | Iwama | G01R 33/34 |
| | | | 324/322 |
| 2014/0145722 A1* | 5/2014 | Suzuki | G01R 33/34076 |
| | | | 324/322 |
| 2014/0197832 A1* | 7/2014 | Driesel | H01Q 7/04 |
| | | | 324/307 |
| 2015/0102813 A1 | 4/2015 | Dumoulin et al. | |
| 2019/0170837 A1* | 6/2019 | Findeklee | G01R 33/3628 |

OTHER PUBLICATIONS

Stewart et al.; "Reproducibility of quantitative indices of lung function and microstructure from 129Xe chemical shift saturation recovery (CSSR) MR spectroscopy"; Magnetic Resonance in Medicine; vol. 77; Jun. 2017; p. 2107-2113.

Kaushik et al.; "Single-breath clinical imaging of hyperpolarized 129xe in the airspaces, barrier, and red blood cells using an interleaved 3D radial 1-point Dixon acquisition"; Magnetic Resonance in Medicine; vol. 75; Apr. 2016; p. 1434-1443.

Ruppert et al.; "Detecting pulmonary capillary blood pulsations using hyperpolarized xenon-129 chemical shift saturation recovery (CSSR) MR spectroscopy"; Magnetic Resonance in Medicine; vol. 75; Apr. 2016; p. 1771-1780.

Wetterling et al.; "Whole body sodium MRI at 3T using an asymmetric birdcage resonator and short echo time sequence: first images of a male volunteer"; Physics in Medicine & Biology; vol. 57; 2012; p. 4555-4567.

Zanche et al.; "Asymmetric quadrature split birdcage coil for hyperpolarized 3He lung MRI at 1.5T"; Magnetic Resonance in Medicine; vol. 60; Aug. 2008; p. 431-438.

Dregely et al.; "32-channel phased-array receive with asymmetric birdcage transmit coil for hyperpolarized xenon-129 lung imaging"; Magnetic Resonance in Medicine; vol. 70; Aug. 2013; p. 576-583.

International Patent Application No. PCT/US2019/036472; Int'l Search Report and the Written Opinion; dated Aug. 28, 2019; 20 pages.

\* cited by examiner

Optimized Design 1  Optimized Design 2

Optimized Design 1 with flat endrings     Optimized Design 2 with stretched endrings 70cm shield 78cm shield

ASYMMETRIC BIRDCAGE COIL FOR A MAGNETIC RESONANCE IMAGING (MRI)

CROSS REFERENCE TO RELATED APPLICATIONS

The current application claims priority to U.S. Provisional Application, Ser. No. 62/683,252, filed Jun. 11, 2018, the entire disclosure of which is incorporated herein by reference.

BACKGROUND

Magnetic Resonance Imaging (MRI) employs a strong magnetic field, B0, that is used to polarize the spin magnetization in a patient's body. The spin magnetization that is most often used in MRI arises from the nuclei of hydrogen atoms within the body. Although the highest concentration of hydrogen atoms within the body is found in water molecules, other compounds found in the body (e.g. lipids, glucose, etc.) are present in sufficient concentration to provide a detectable MR spin magnetization. MRI can be performed on a number of nuclei such as hydrogen-1 (referred to as proton), helium-3, lithium-7, carbon-13, fluorine-19, oxygen-17, sodium-23, phosphorus-31 and xenon-129. In most MRI applications, hydrogen-1 can be preferred due to its high gyromagnetic ratio and abundance in most tissues in the body, which can translate into high signal-to-noise ratio ("SNR").

When spin ½ nuclei of a patient's body are introduced into the polarizing magnetic field, the spin magnetization of the nuclei align in one of two states: with the magnetic field, or against the magnetic field. These two states occupy slightly different energy levels in a quantum mechanical system. By convention, the lowest energy level is called the ground state. It should be noted that the population of nuclear spins in the ground state is slightly higher than that of the higher energy state, resulting in a net magnetization of the macroscopic group of nuclei.

The energy difference between the two energy levels is directly proportional to the strength of the polarizing magnetic field. Thus, as the strength of the magnetic field is increased, the energy difference between the two states increases. The energy differences associated with typical MRI systems correspond to electromagnetic waves in the radiofrequency range. The specific frequency associated with the difference is called the Larmor frequency (typically given in MHz). The constant of proportionality that defines the relationship between the polarizing field (typically given in Tesla) and the Larmor frequency is a natural constant called the gyromagnetic ratio. This constant is unique for each MR active element. For Magnetic Resonance Imaging systems used in medicine, polarizing magnetic field fields are typically between 0.5 and 3.0 Tesla. For hydrogen atoms, these polarizing magnetic field strengths result in Larmor frequencies between 21.3 and 127.8 MHz. For xenon-129, these polarizing magnetic field strengths result in Larmor frequencies between 5.89 and 35.33 MHz. For xenon-129 a dedicated transmit coil is required with 35.3 MHz resonance at 3T.

If the nuclear spin system immersed in a polarizing magnetic field is subjected to a rotating magnetic field at the Larmor frequency, B1, the spin system will absorb energy and the distribution of nuclear spins in the two energy states will be disturbed. The duration of the rotating magnetic field used to change the distribution of nuclear spins in the two energy states is typically limited, and applied with a strength sufficient to nutate the net spin magnetization from the longitudinal axis (i.e. parallel with the applied polarizing magnetic field) to the transverse plane (i.e. perpendicular to the applied polarizing field). The term "RF pulse" is conventionally used to describe this process since nutation is accomplished with a rotating magnetic field in the radiofrequency range and having a finite duration With time, the energy will be emitted by the spin system in a fashion that can be detected with a sensitive pickup coil. The absorption and re-emission of an RF signal is key to the formation of an MR image. This phenomenon is typically called "resonance".

When an MR signal is created, the frequency of the signal is precisely proportional to the strength of the magnetic field experienced by the nuclear spins. If all of the spins in a patient's body are in an identical magnetic field, then all the spins will resonate with the same frequency. Even though signals come from many different portions of the body, the MR imaging system has no way to distinguish one signal from another.

In order to provide spatial encoding of the MR signals (and hence enable the formation of an image), it is useful to create a transient inhomogeneity in the magnetic field. In typical MRI imaging systems this is accomplished with magnetic field gradient coils. Gradient coils typically are designed to create a magnetic field whose strength varies in a linear fashion over a selected volume within the magnet. Gradient coil sets are typically constructed to permit gradient fields to be created in three orthogonal directions within the bore of the magnet. Typical gradient coils driven by typical gradient amplifiers can generate a magnetic field gradient of 20 mT/m in less than 1 ms, and maintain that gradient with high fidelity for an extended period limited only by the heat dissipation of the gradient coils and amplifier.

A typical imaging system creates an image by employing a sequence of RF and magnetic field gradient pulses to establish a detectable MR signal in a selected plane. This signal is then spatially encoded using magnetic field gradient pulses to impart phase and frequency shifts to the MR signal which reveal the location of the signal source within the bore of the magnet. By selecting pulse sequence repetition times (TR), echo times (TE) and other pulse sequence parameters, the operator can tune the pulse sequence to be sensitive to a variety of intrinsic MR parameters found in the tissue of the patient (e g. longitudinal relaxation time, T1, Transverse relaxation time, T2, and the like). Many pulse sequences are known to those skilled in the state of the art. These pulse sequences can collect data in two or three dimensions. They can also collect data in Cartesian, radial or spiral frameworks.

Hyperpolarized $^{129}$Xe imaging is increasingly viewed as a viable tool for assessing lung structure and function in patients[1]. Additionally, HP $^{129}$Xe is moderately soluble in tissues and possesses a large (>200 ppm) in-vivo chemical shift range, making dissolved-phase $^{129}$Xe MR uniquely sensitive to regional gas-exchange dynamics[2-4]. Selective excitation of dissolved $^{129}$Xe requires that large flip angle and frequency selective RF pulses be applied homogeneously across the entire thorax to avoid unintentionally exciting the gas-phase $^{129}$Xe. In general, the flip angle of an RF pulse increases with the duration of the pulse. With $^{129}$Xe MRI, however, a pulse duration that is longer than the gas exchange time loses its selectivity. Thus, there is a need for high B1 fields during excitation of $^{129}$Xe in the dissolved state. Furthermore, $^{129}$Xe body coils that fail to provide sufficiently uniform B1 fields will provide a spatially dependent B1 field. Since the flip angle of the RF pulse is an important contributor to the quantitative measurements of gas exchange, a homogeneous $^{129}$Xe body coil is desired.

Body coils in the form of birdcage coils are traditionally constructed using a cylindrical birdcage design with equidistant rung-spacing centered in the magnet's RF shield. Due to the restricted space available for placing a $^{129}$Xe body coil in a general-purpose MRI system, asymmetrical $^{129}$Xe birdcage coils have been developed to fit within the magnet bore and yet account for the presence of the patient table. Such asymmetrical coils have a generally flat bottom for riding on top of the patient table[5-7], producing a generally domed shape in cross-section (generally flat bottom to account for patient table but a cylindrical side and top to match the curvature of the magnet bore). However, the B1 homogeneity of theses designs was evaluated with the coil unloaded and only within the central slice locations. Thus, it remains unclear if these designs are suitable for truly quantitative dissolved-phase $^{129}$Xe MRI.

Thus, there is a need to develop such asymmetrical birdcage coil designs for homogeneous volume excitation for $^{129}$Xe imaging (and nuclei).

SUMMARY

To develop a suitable large and homogeneous $^{129}$Xe 3T birdcage coil, the volume excitation performance of multiple coil designs was analyzed with electromagnetic simulations. The influence of the shield size and position of the coils were analyzed in detail. Results of the analysis were used to confirm exemplary optimized designs for homogeneous volume excitation necessary for $^{129}$Xe imaging.

As a result of such analysis, a first aspect of the current disclosure is to provide a birdcage coil for a magnetic resonance imaging (MRI) system that includes: (a) a pair of conductive end rings, each having a generally domed shape in axial cross section; (b) a plurality of conductive, elongated rungs extending between the pair of conductive end rings in an axial direction; and (c) an LC delay circuit incorporated into the pair of rings and the plurality of elongated rungs, where the LC delay circuit includes a plurality of capacitive elements and a plurality of inductive elements; where circumferential spacing between adjacent elongated rungs is varied to improve homogeneity of the volume excitation.

In a detailed embodiment of this first aspect, the length of the elongated rungs is varied so that the area between adjacent elongated rungs is substantially the same. In a further detailed embodiment, one or both of the pair of end rings are non-planar to account for the varied lengths of the elongated rungs.

In another detailed embodiment of this first aspect, the capacitive elements in the LC delay circuit are varied. In a further detailed embodiment, the capacitive elements in the LC delay circuit are varied to maintain a steady speed of delay about a circumference of the birdcage coil.

In another detailed embodiment of this first aspect, the varied circumferential spacing between adjacent elongated rungs is symmetrical between the left side and right side of the birdcage coil (where the bottom is the generally flat portion). Alternatively, or in addition, the varied circumferential spacing is wider on a bottom half and closer on a top half.

In another detailed embodiment of this first aspect, the birdcage coil is a high-pass birdcage coil, or the birdcage coil is a low-pass birdcage coil, or the birdcage coil is a band-pass coil. Alternatively, or in addition, the birdcage coil includes sixteen of the conductive, elongated rungs extending between the pair of conductive end rings in an axial direction.

A second aspect of the current disclosure is to provide a birdcage coil for a magnetic resonance imaging (MRI) system that includes: (a) a pair of conductive end rings, each having a generally domed shape in axial cross section; (b) a plurality of conductive, elongated rungs extending between the pair of conductive end rings in an axial direction; and (c) an LC delay circuit incorporated into the pair of rings and the plurality of elongated rungs, where the LC delay circuit includes a plurality of capacitive elements and a plurality of inductive elements; where at the capacitive elements and/or inductive elements are varied to provide a uniform rotational velocity of the magnetic field about a circumference of the birdcage coil. In a more detailed embodiment, the generally domed shaped end rings have a generally flat bottom, a generally rounded top, a left side and a right side; and the varied capacitive elements and/or inductive elements are symmetrical between the left side and right side. Alternatively, or in addition, the varied capacitive/inductive elements involves varied inductive elements. In a more detailed embodiment, the varied inductive elements involves varied dimensions of the elongated rungs. In a more detailed embodiment, the varied dimensions of the elongated rungs involve varied lengths of the elongated rungs and/or varied diameters of the elongated rungs.

A third aspect of the current disclosure is to provide a birdcage coil for a magnetic resonance imaging (MRI) system that includes: a pair of conductive end rings, each having at least one asymmetric dimension in axial cross section; a plurality of conductive, elongated rungs extending between the pair of conductive end rings in an axial direction; and an LC delay circuit incorporated into the pair of rings and the plurality of elongated rungs, where the LC delay circuit includes a plurality of capacitive elements and a plurality of inductive elements; where circumferential spacing between adjacent elongated rungs is varied to improve homogeneity of the volume excitation.

In a detailed embodiment of the third aspect, the length of the elongated rungs is varied so that the area between adjacent elongated rungs is substantially the same. In a further detailed embodiment, the pair of end rings are non-planar to account for the varied lengths of the elongated rungs.

In another detailed embodiment of the third aspect, the capacitive elements in the LC delay circuit are varied. In a further detailed embodiment, the capacitive elements in the LC delay circuit are varied to maintain a steady speed of delay about a circumference of the birdcage coil.

These and other aspects and objects of the current disclosure will be apparent from the following description, the appended claims and the attached drawings.

DETAILED DESCRIPTION

MR imaging of internal body tissues may be used for numerous medical procedures, including diagnosis and surgery. In general terms, MR imaging starts by placing a subject in a relatively uniform, static magnetic field. The static magnetic field causes MR-active nuclei spins to align and precess about the general direction of the magnetic field. Radio frequency (RF) magnetic field pulses are then superimposed on the static magnetic field to cause some of the aligned spins to alternate between a temporary high-energy nonaligned state and the aligned state, thereby inducing an RF response signal, called the MR echo or MR response signal. It is known that different tissues in the subject produce different MR response signals, and this property can be used to create contrast in an MR image. An RF receiver detects the duration, strength, and source location of the MR response signals, and such data are then processed to generate tomographic or three-dimensional images.

Figure 1:
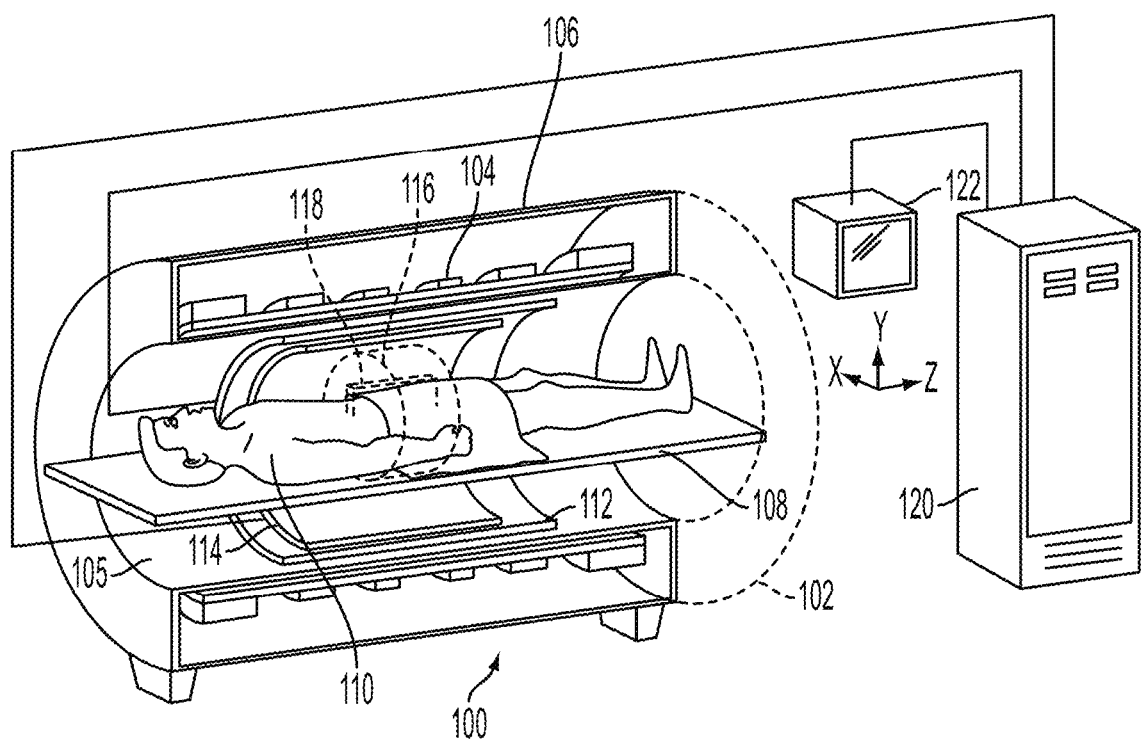
FIG. 1 is a block diagram representation of an MRI system environment for use with embodiments of the current disclosure.
Figure 2:
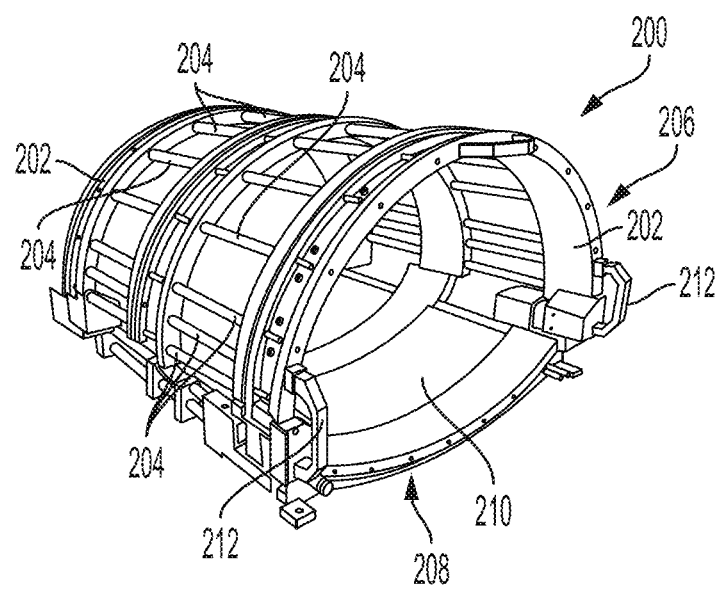
FIG. 2 is a perspective view of an exemplary birdcage coil according to an embodiment of the current disclosure.

FIG. 1 shows an exemplary MRI system 100 in or for which MR imaging in accordance with the present disclosure may be implemented. The illustrated MRI system 100 comprises an MRI magnet assembly 102. Since the components and operation of the MRI scanner are well-known in the art, only some basic components helpful in the understanding of the system 100 and its operation will be described herein.

The MRI magnet assembly 102 typically comprises a cylindrical superconducting magnet 104, which generates a static magnetic field within a bore 105 of the superconducting magnet 104. The superconducting magnet 104 generates a substantially homogeneous magnetic field within an imaging region 116 inside the magnet bore 105. The superconducting magnet 104 may be enclosed in a magnet housing 106. A support table 108, upon which a patient 110 lies, is disposed within the magnet bore 105. A region of interest 118 within the patient 110 may be identified and positioned within the imaging region 116 of the MRI magnet assembly 102.

A set of cylindrical magnetic field gradient coils 112 may also be provided within the magnet bore 105. The gradient coils 112 also surround the patient 110. The gradient coils 112 can generate magnetic field gradients of predetermined magnitudes, at predetermined times, and in three mutually orthogonal directions within the magnet bore 105. With the field gradients, different spatial locations can be associated with different precession frequencies, thereby giving an MR image its spatial resolution. An RF transmitter coil 114 surrounds the imaging region 116 and the region of interest 118. The RF transmitter coil 114 emits RF energy in the form of a rotating magnetic field into the imaging region 116, including into the region of interest 118.

The RF transmitter coil 114 can also receive MR response signals emitted from the region of interest 118. The MR response signals are amplified, conditioned and digitized into raw data using an image processing system 120, as is known by those of ordinary skill in the art. The image processing system 120 further processes the raw data using known computational methods, including fast Fourier transform (FFT), into an array of image data. The image data may then be displayed on a monitor 122, such as a computer CRT, LCD display or other suitable display.

Due to the size required for a $^{129}$Xe MRI body coil, asymmetrical birdcage coils have been developed that allow the $^{129}$Xe coil to fit within the bore and yet account for the presence of the patient table. Such asymmetrical coils have a generally flat bottom for riding on top of the patient table[5-7], producing a generally domed shape in cross-section (generally flat bottom to account for patient table but a cylindrical side and top to match the curvature of the magnet bore). The asymmetrical domed shape in cross-section allows the birdcage coils to fit snugly within the bore 105 opening over the support table 108.

Figure 3:
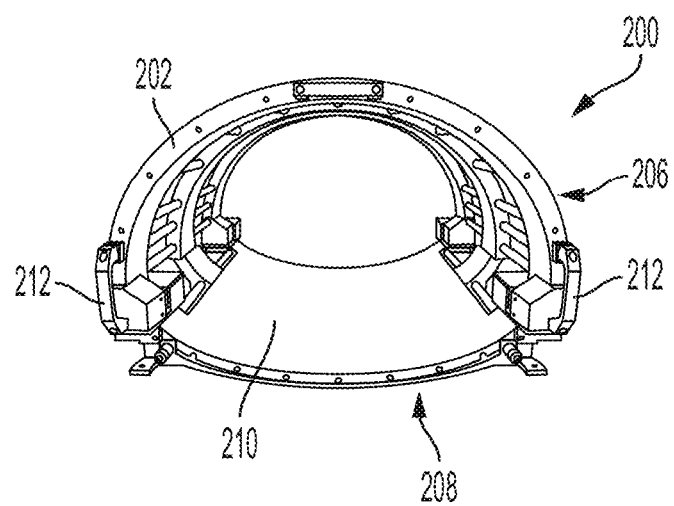
FIG. 3 is an end view of the exemplary birdcage coil of FIG. 2.
Figure 4:
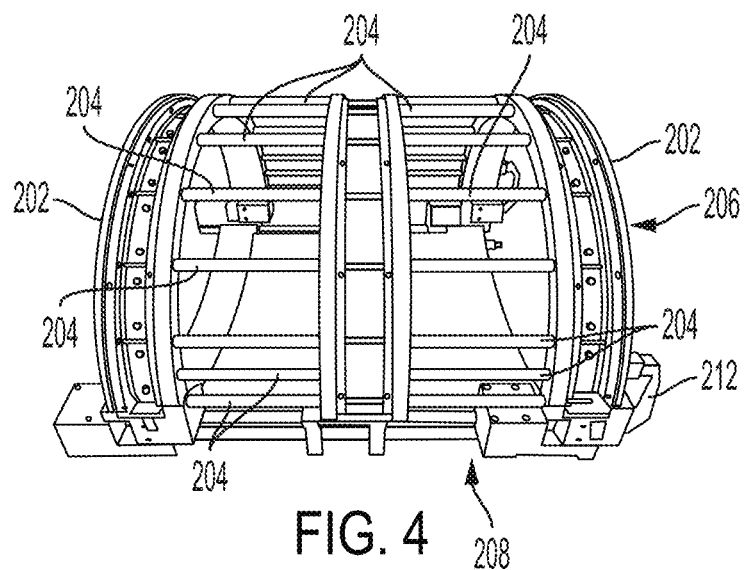
FIG. 4 is a side view of the exemplary birdcage coil of FIG. 2.
Figure 5:
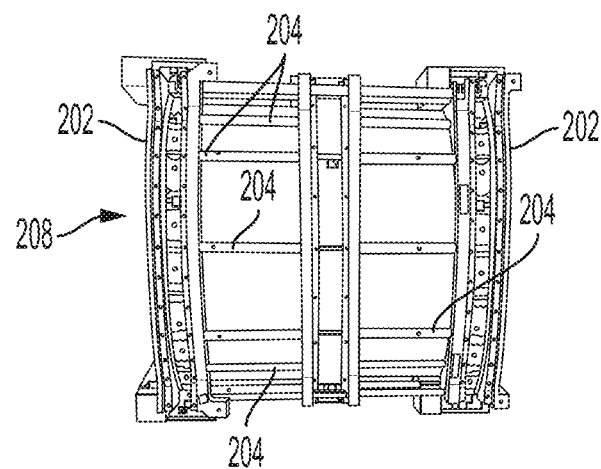
FIG. 5 is a bottom view of the exemplary birdcage coil of FIG. 2.

FIGS. 2-5 provide various views of an example asymmetrical birdcage coil 200 according the current disclosure. The asymmetrical birdcage coil 200 has a pair of conductive end rings 202, each having a generally domed shape in axial cross section (as best seen in FIG. 3), and a plurality of conductive, elongated rungs 204, extending between the conductive end rings 202. While the coil 200 in FIGS. 2-5 is a high-pass birdcage, it is within the scope of the current disclosure that the coil may be in the form of a low-pass birdcage or a band-pass birdcage.

The example birdcage coil 200 of FIGS. 2-5 has a top portion 206 and a bottom portion 208 that are coupled together to form the enclosing coil structure. A surface 210 is provided on the interior portion of the bottom portion 208 for the patient to lie upon. Handles 212 are provided to allow ease in separating, handling and coupling together the top and bottom portions 206, 208.

The birdcage coil 200 also includes an LC delay circuit incorporated into the coil as is well known to those of ordinary skill. The LC delay circuit will include a plurality of capacitive components and a plurality of inductive elements. In the embodiment shown in FIG. 2-5 circumferential spacing between adjacent elongated rungs 204 is varied to improve homogeneity of the volume excitation.

The specific measured circumferential spacing between elongated rungs 204 of the embodiment shown in FIGS. 2-5 (and the associated inductance as a result of such spacing) is provided in the following Table 1 and 2:

TABLE 1

Top-Portion Birdcage End-ring Lengths

| Length | | Inductance | |
|---|---|---|---|
| Front | Back | Front | Back |
| 1: 54 mm | 54 mm | 21 mH | 21 mH |
| 2: 78 mm | 78 mm | 36 mH | 36 mH |
| 3: 81 mm | 81 mm | 38 mH | 38 mH |
| 4: 85 mm | 85 mm | 41 mH | 41 mH |
| 5: 88 mm | 88 mm | 43 mH | 43 mH |
| 6: 89 mm | 89 mm | 44 mH | 44 mH |
| 7: 89 mm | 89 mm | 44 mH | 44 mH |
| 8: 85 mm | 85 mm | 41 mH | 41 mH |
| 9: 81 mm | 81 mm | 38 mH | 38 mH |
| 10: 78 mm | 78 mm | 36 mH | 36 mH |
| 11: 55 mm | 55 mm | 22 mH | 22 mH |

TABLE 2

Bottom Portion Birdcage End-ring Lengths

| Length | | Inductance | |
|---|---|---|---|
| Front | Back | Front | Back |
| 1: 73 mm | 73 mm | 33 mH | 33 mH |
| 2: 136 mm | 136 mm | 77 mH | 76 mH |
| 3: 149 mm | 149 mm | 87 mH | 87 mH |
| 4: 135 mm | 135 mm | 77 mH | 77 mH |
| 5: 71 mm | 71 mm | 32 mH | 32 mH |

Each of the rungs 204 in the embodiment shown in FIGS. 2-5 is approximately 547 mm long and 6.36 mm in diameter.

As can be seen in Tables 1 and 2, the dimensions between the front and back segments for this embodiments are intended to be identical. However, actual measurements may produce manufacturing or assembly variation differences of two or three millimeters. Referring to FIG. 3, the end ring segments listed in Tables 1 and 2 run in a clockwise direction, with the first segment of the upper portion located behind the left handle 212 and the last segment behind the right handle. For the bottom portion, the first segment is below the right handle 212 and the last segment is below the left handle.

Figure 6:
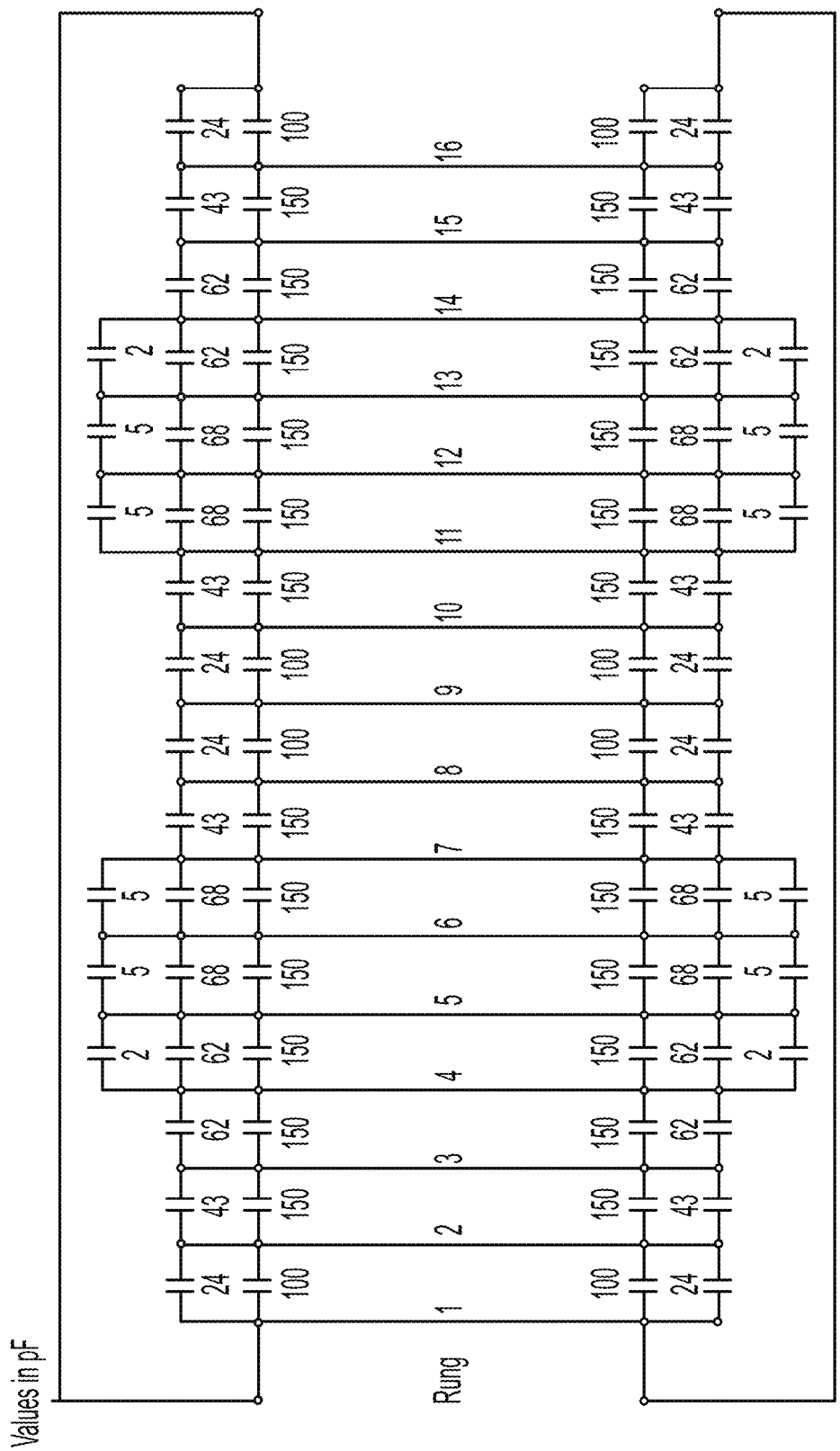
FIG. 6 is a circuit capacitance diagram representation of the birdcage coil of FIG. 2.

FIG. 6 provides the specific varying capacitance values for the LC circuit of the embodiment of FIGS. 2-5. These capacitance values were determined empirically on the bench to tune the coil to the $^{129}$Xe Larmor frequency at 3 Tesla. Note that FIG. 6 illustrates how a birdcage coil can be modeled as a delay line in which the inductances (rungs 1 through 16) and capacitances are selected to provide one full wavelength along the circumference of the coil. In the present embodiment of the invention, the capacitance values and spacing of the rungs is varied using electromagnetic simulations to optimize B1 homogeneity. In alternate embodiments the length of the inductive rungs is also varied.

With this embodiment, the varied circumferential spacing between the rungs 204 is generally symmetrical (as discussed above, with the exemplary embodiment there can be 2-3 mm variance) between the left and right sides (looking end-on as shown in FIG. 3). The varied spacing between the rungs 204 is wider in the bottom portion as compared to the top portion. The capacitances shown in FIG. 6 are chosen based upon an algorithm designed to maintain the steady speed delay about a circumference of the birdcage coil 200 based upon the inductance values measured in Tables 1 & 2.

In an embodiment, the rung spacing is a function of: the location of the birdcage inside the RF shield, the distance of each rung to the RF shield, and the shape of the ellipse that the rung location follows. For example, in the section of the birdcage coil where the shape follows an ellipse that is close to a cylindrical shape and the proximity of the rungs is close to the RF shield, the spacing/distance between the rungs is smaller—the rung density is larger. And in the section of the birdcage coil where the shape follows an ellipse that is stretched (more flat) and rungs are farther away from the RF shield, the spacing/distance between the rungs is larger—the rung density is smaller.

An important aspect of certain embodiments is that dynamic detuning of the birdcage coil is possible using approaches well known to those skilled in the state of the art. Dynamic detuning is useful for preventing inductive coupling of the birdcage coil with receive coils placed inside the birdcage coil. The use of receive coils that are smaller than the body coil permits greater sensitivity to the MR signal and offers higher Signal to Noise Ratios. The use of receive coil arrays offers the additional advantage of enabling image acquisition acceleration. Dynamic detuning is typically performed using resonant traps placed at various locations in the body coil. These traps are typically activated with bias currents that turn on diodes placed in the trap circuitry. In one embodiment, one trap is placed in the center of each rung of the body coil.

Development of the asymmetrical birdcage design according to the current embodiment is now described.

Figure 8:
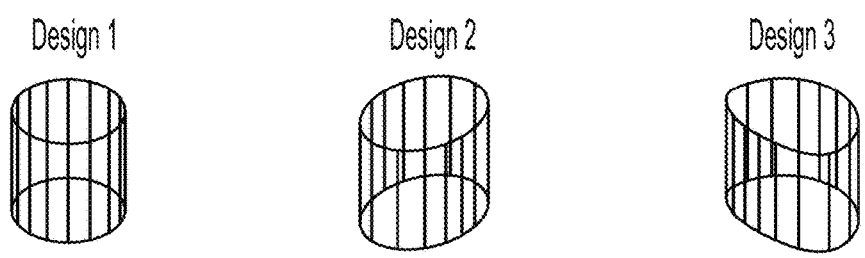
FIG. 8 is a representation of three initial analyzed coil designs in the analysis.
Figure 9:
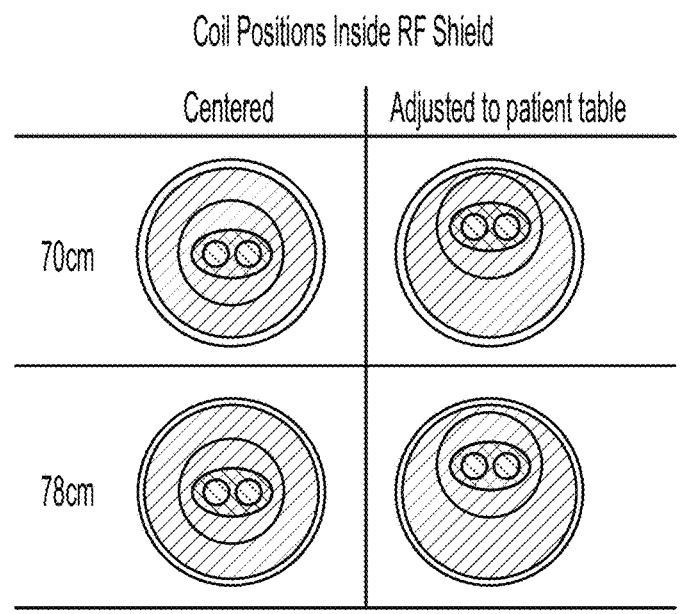
FIG. 9 is a representation of the coil positions inside the RF shield for the analyzed coil designs of FIG. 8.

Methods:

Electromagnetic field simulations were performed for three different 16-rung birdcage coil designs in electromagnetic simulation, as shown in FIG. 8: Design 1—cylindrical birdcage; Design 2—symmetrical elliptical birdcage; and Design 3—elliptical birdcage combined with two ellipse-halves with different short axes with rungs spaced equidistant. As shown in FIG. 9, each coil design was simulated with two RF shield diameters, 70 cm and 78 cm, at two locations, centered and adjusted to the patient table inside the RF shield.

Figure 7:
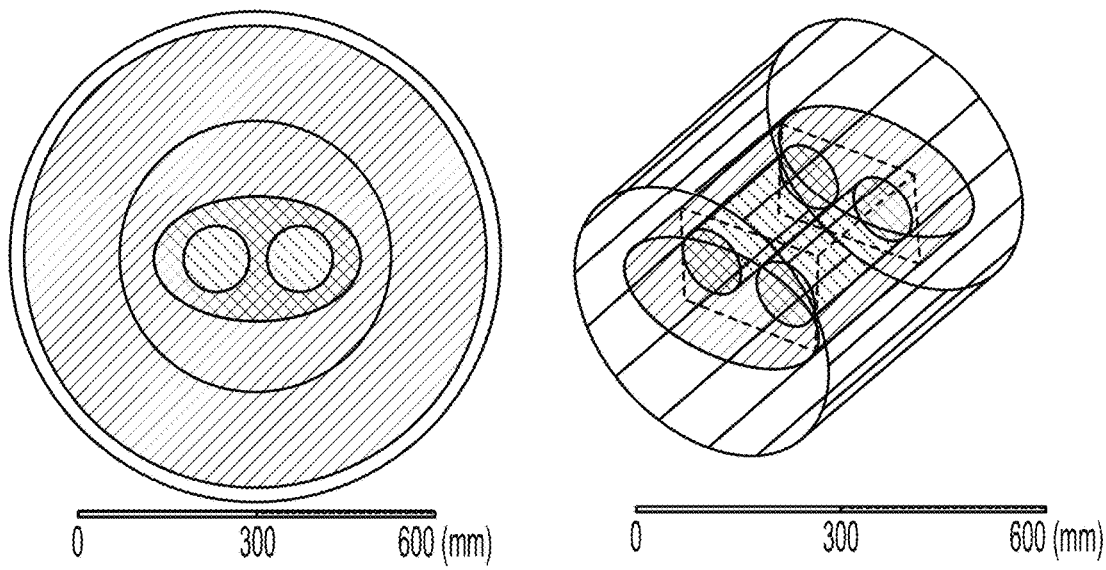
FIG. 7 is a representation of the simulation set-up using an elliptical phantom for developing birdcage coil designs disclosed herein.

As shown in FIG. 7, coils were loaded with a centered torso-shaped elliptical phantom 300 ($\varepsilon_r$=77.53 conductivity 0.4 S/m) with two cylinders 302 ($\varepsilon_r$=1) inside the phantom representing adult-sized xenon-air filled lungs.

Figure 10:
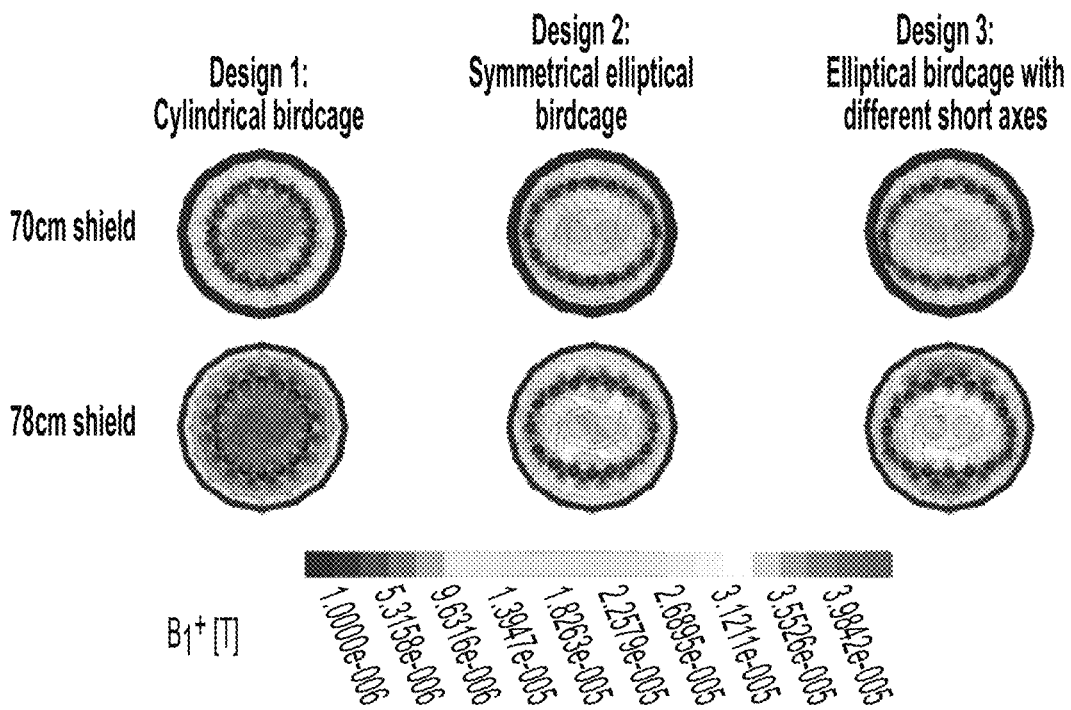
FIG. 10 shows the $B_1^+$ field distribution for the central axial slice with the coils of FIG. 8 centered inside the RF shield.
Figure 11:
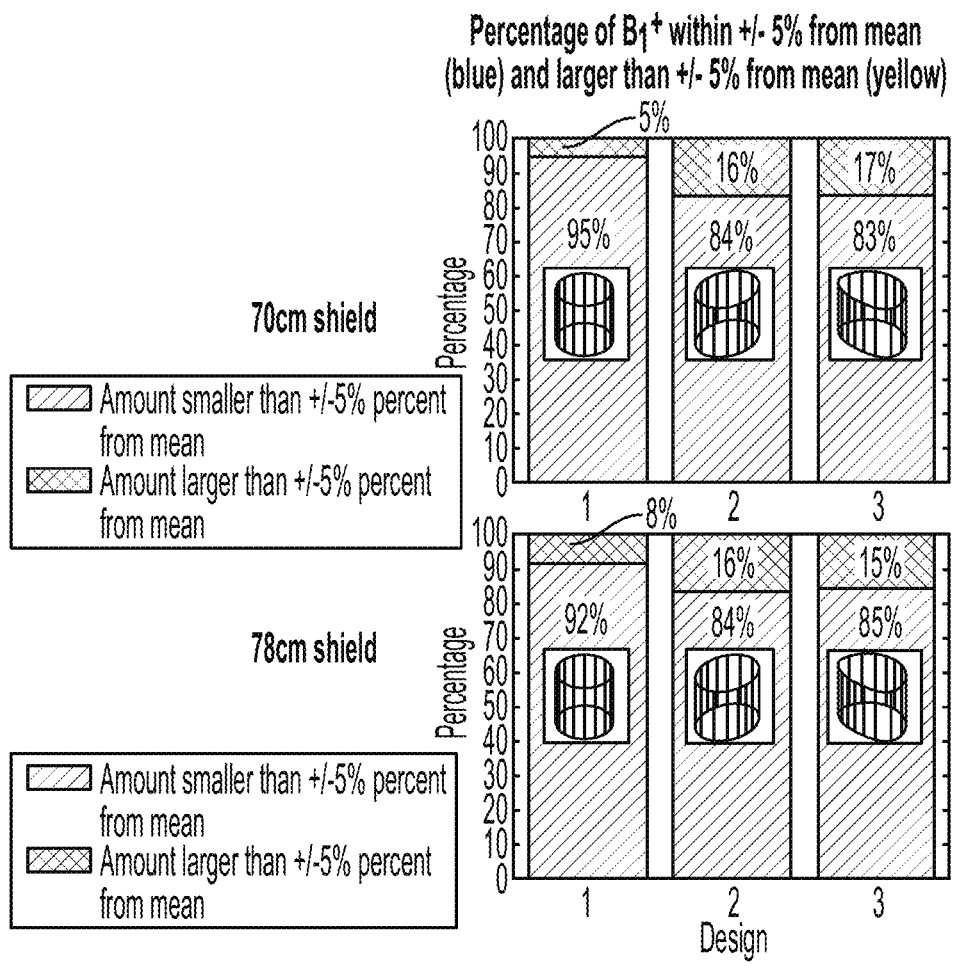
FIG. 11 shows the percentage of $B_1^+$ within +/−5% from mean and larger than +/−5% from mean for the coils of FIG. 8 centered inside the RF shield.
Figure 12:
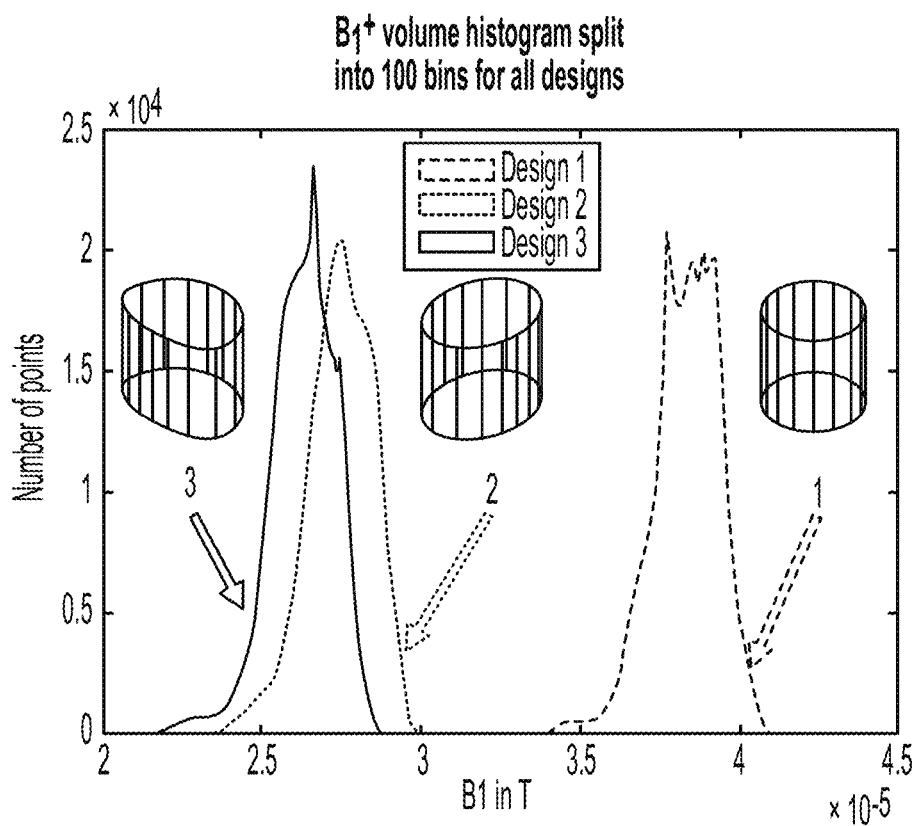
FIG. 12 shows the $B_1^+$ volume histogram split into 100 bins for the coils of FIG. 8 centered inside the RF shield.
Figure 12:
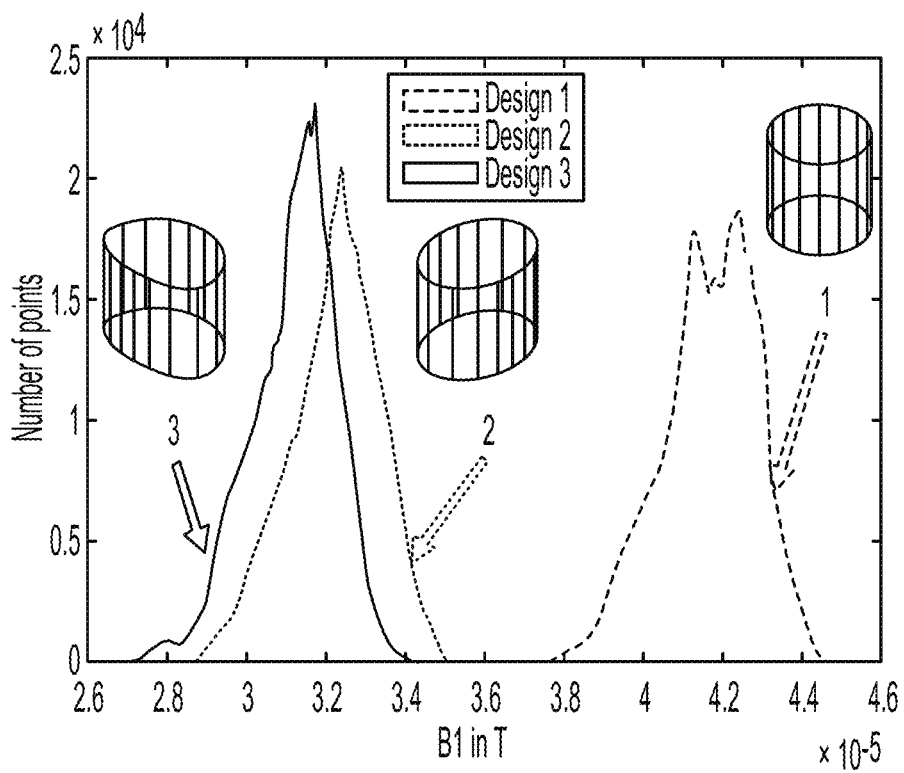

The birdcages of FIG. 8 were excited with 35.3 MHz, 6A current sources placed at the center of each rung with phase shift increments of 22.5°. Field maps of the center axial slice and $B_1^+$ histograms for a 17 cm×25 cm×25 cm VOI centered inside the phantom were used for analytical comparison. A preferred deviation range inside the VOI of +/−5% from the mean $B_1^+$ was chosen as the target margin for comparison. FIG. 10 shows the $B_1^+$ field deviation for the central axial slice with the coils of FIG. 8 centered inside the RF shield. All of the three birdcage designs centered have a homogeneous $B_1^+$ axial slice profile. FIGS. 11 and 12 show the $B_1^+$ volume deviation with coils centered inside the RF shield. Again, all three of the birdcage designs of FIG. 8 have a homogeneous $B_1^+$ volume distribution when centered within the RF shield, where the cylindrical birdcage (Design 1) is the most efficient.

All birdcage designs for the centered shield case show a homogeneity >83% for the target margin of +/−5% from the mean $B_1^+$ inside the VOI. Design 1 has the highest homogeneous profile at 95%, in addition to being the most efficient of the designs. The larger shield diameter improved VOI homogeneity for design 3. Coil mean $B_1^+$ efficiency improved by 3.3 µT for design 1, 4.8 µT for design 2, and 4.9 µT for design 3.

Figure 13:
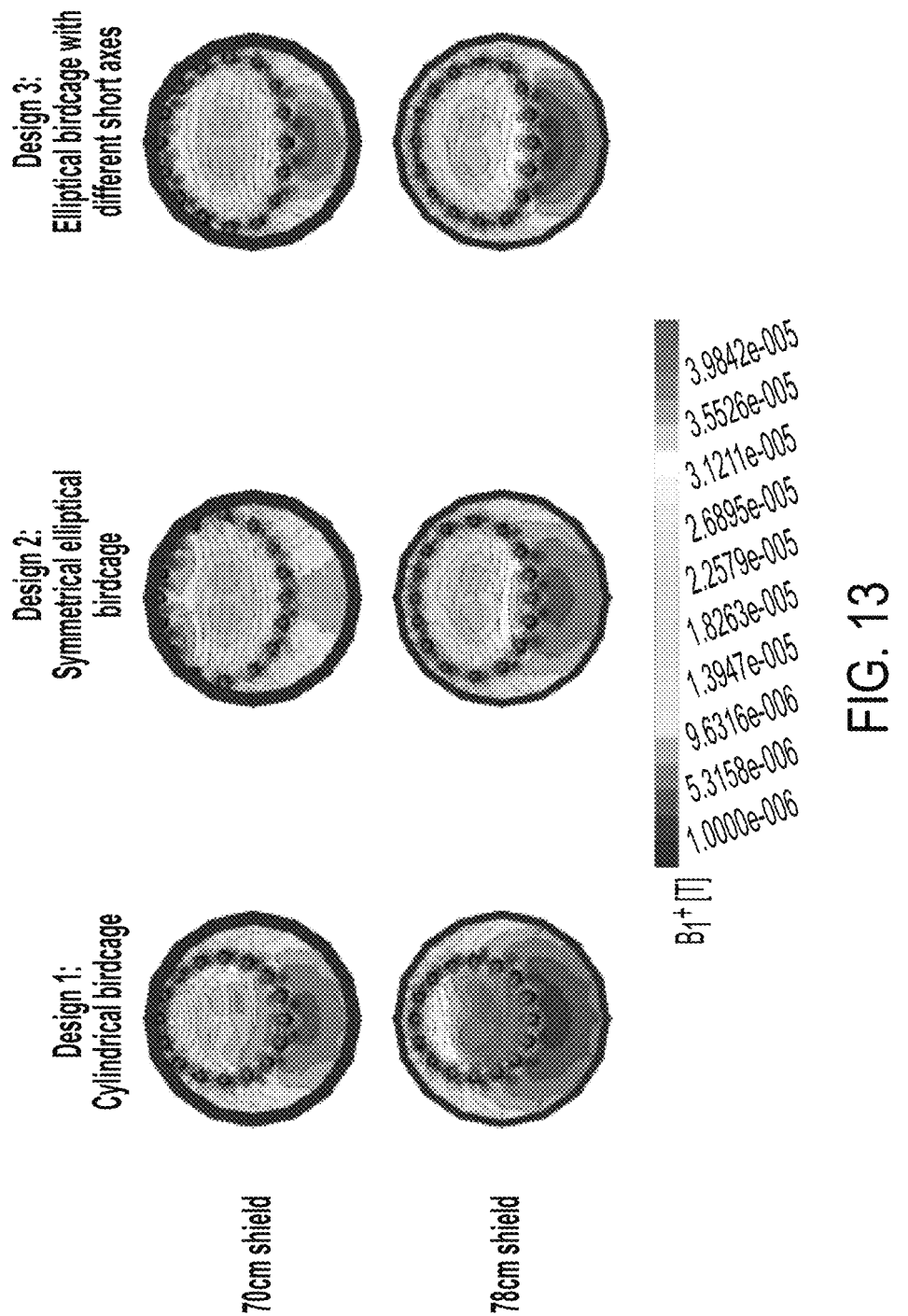
FIG. 13 shows the $B_1^+$ field distribution for the central axial slice with the coils of FIG. 8 adjusted to the patient table.
Figure 14:
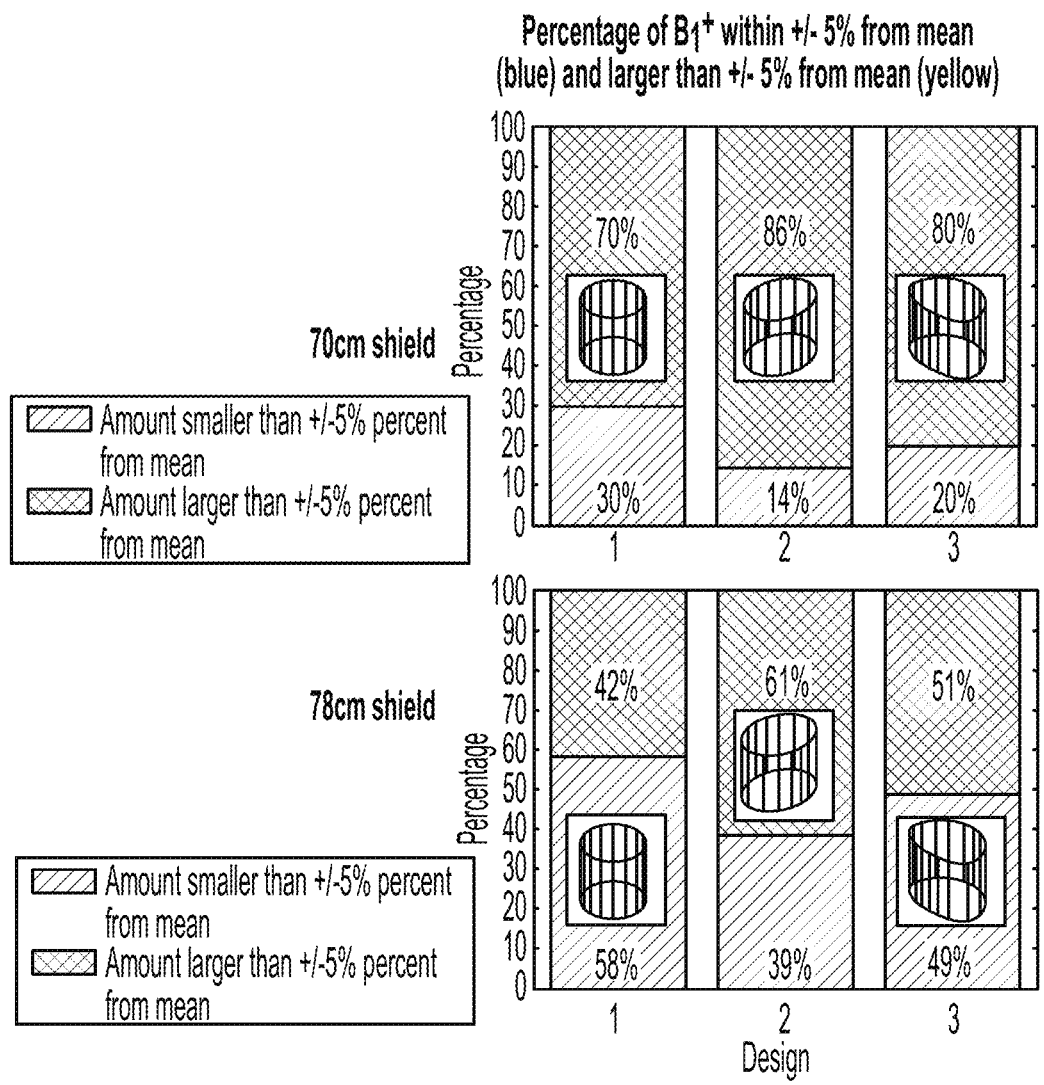
FIG. 14 shows the percentage of $B_1^+$ within +/−5% from mean and larger than +/−5% from mean for the coils of FIG. 8 adjusted for the patient table.
Figure 15:
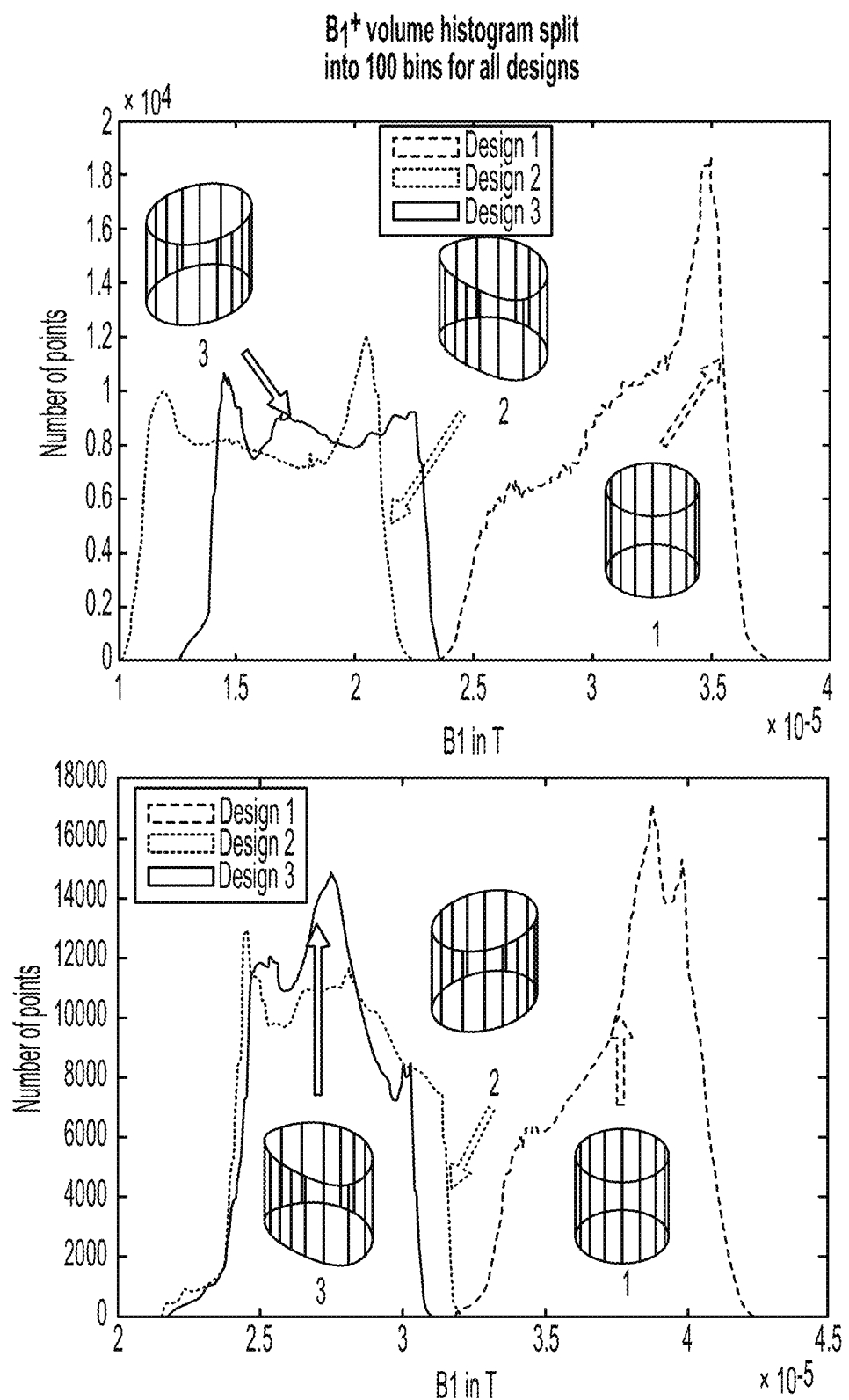
FIG. 15 shows the $B_1^+$ volume histogram split into 100 bins for the coils of FIG. 8 adjusted for the patient table.

But results changed when the birdcage designs of FIG. 8 were moved up in the RF shield to adjust to the patient table. FIG. 13 shows the field distribution for the central axial slice with the coils adjusted to the patient table. All three of the birdcage designs adjusted to the patient table have an inhomogeneous $B_1^+$ axial slice profile. FIGS. 14 and 15 show the $B_1^+$ volume deviation with the coils of FIG. 8 adjusted to the patient table. All three birdcage designs of FIG. 8 adjusted to the patient table have an inhomogeneous $B_1^+$ volume distribution, where the cylindrical (Design 1) is the most efficient.

Designs adjusted to the table position, however, showed highly inhomogeneous excitation profiles. In the patient table configuration, design 1 retained the highest homogeneous $B_1^+$ profile with 30% inside the margin for the 70 cm shield.

Figure 16:
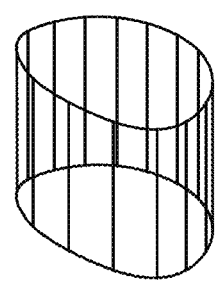
FIG. 16 is a representation of two exemplary improved (i.e., "optimized") coil designs according to the current disclosure.
Figure 16:
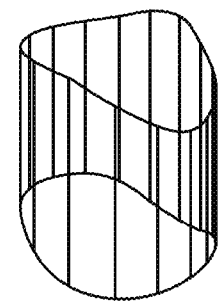
Figure 17:
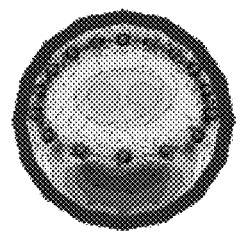
FIG. 17 shows the $B_1^+$ field distribution for the central axial slice with the exemplary coils of FIG. 16 adjusted to the patient table.
Figure 17:
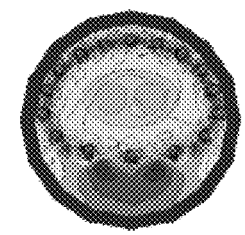
Figure 17:
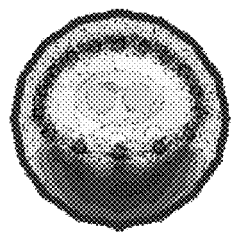
Figure 17:
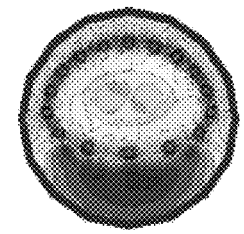
Figure 17:
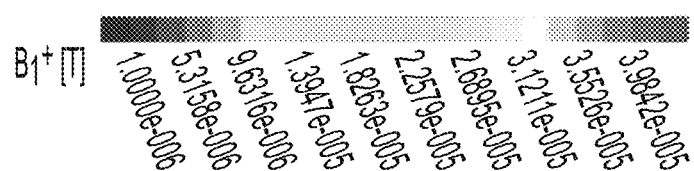

To improve $B_1^+$ homogeneity inside the VOI two optimized designs, shown in FIG. 16, were analyzed using a model that adjusted the coil to the patient table for both RF shield diameters. Optimized Design 1 is an elliptical birdcage with two ellipse-halves with different short axes with rungs spaced wider on the bottom half and closer on the top half. Optimized Design 2 is a stretched end-ring birdcage (non-planar end ring to account for varying length rungs) combined with two ellipse-halves with different short axes with rungs spaced wider on the bottom half and closer on the top half.

Figure 18:
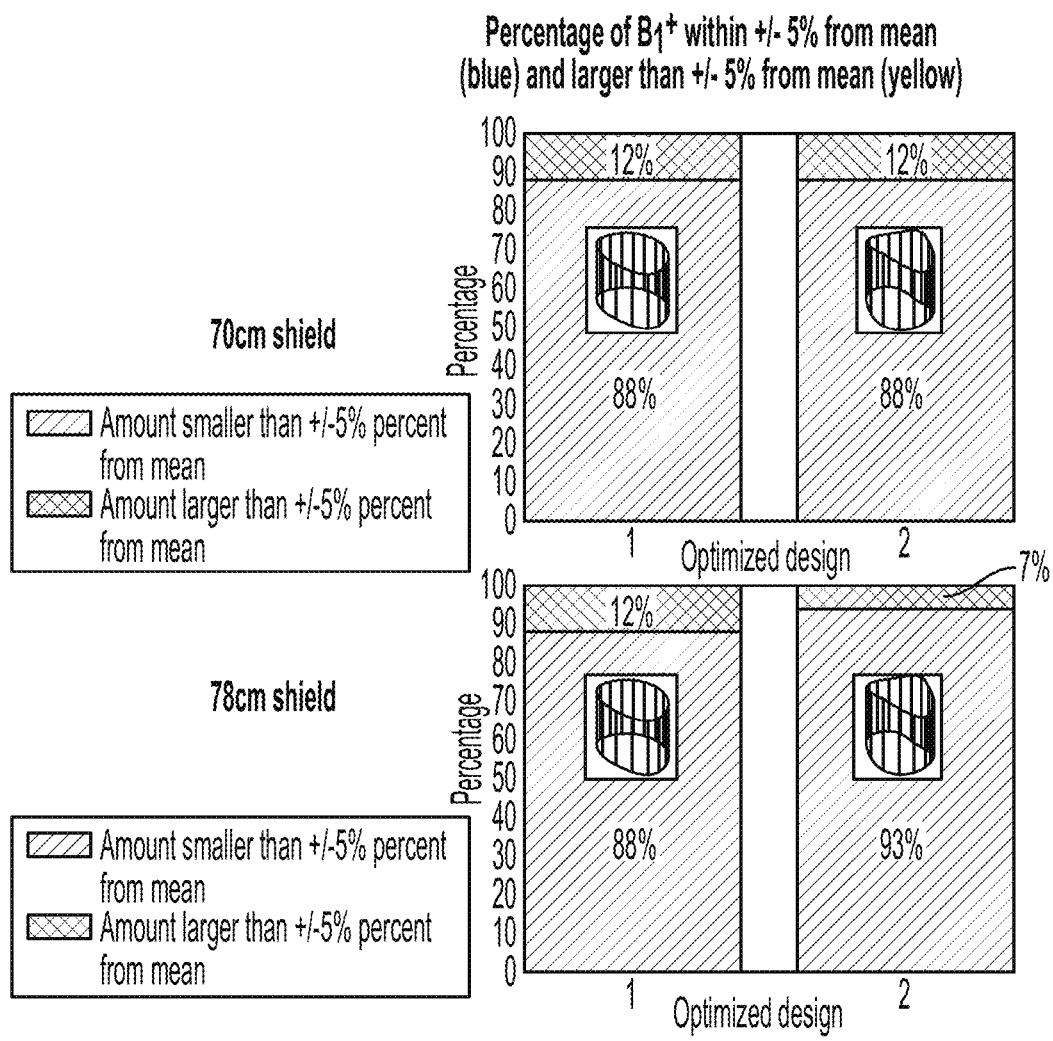
FIG. 18 shows the percentage of $B_1^+$ within +/−5% from mean and larger than +/−5% from mean for the exemplary coils of FIG. 16 adjusted for the patient table.
Figure 19:
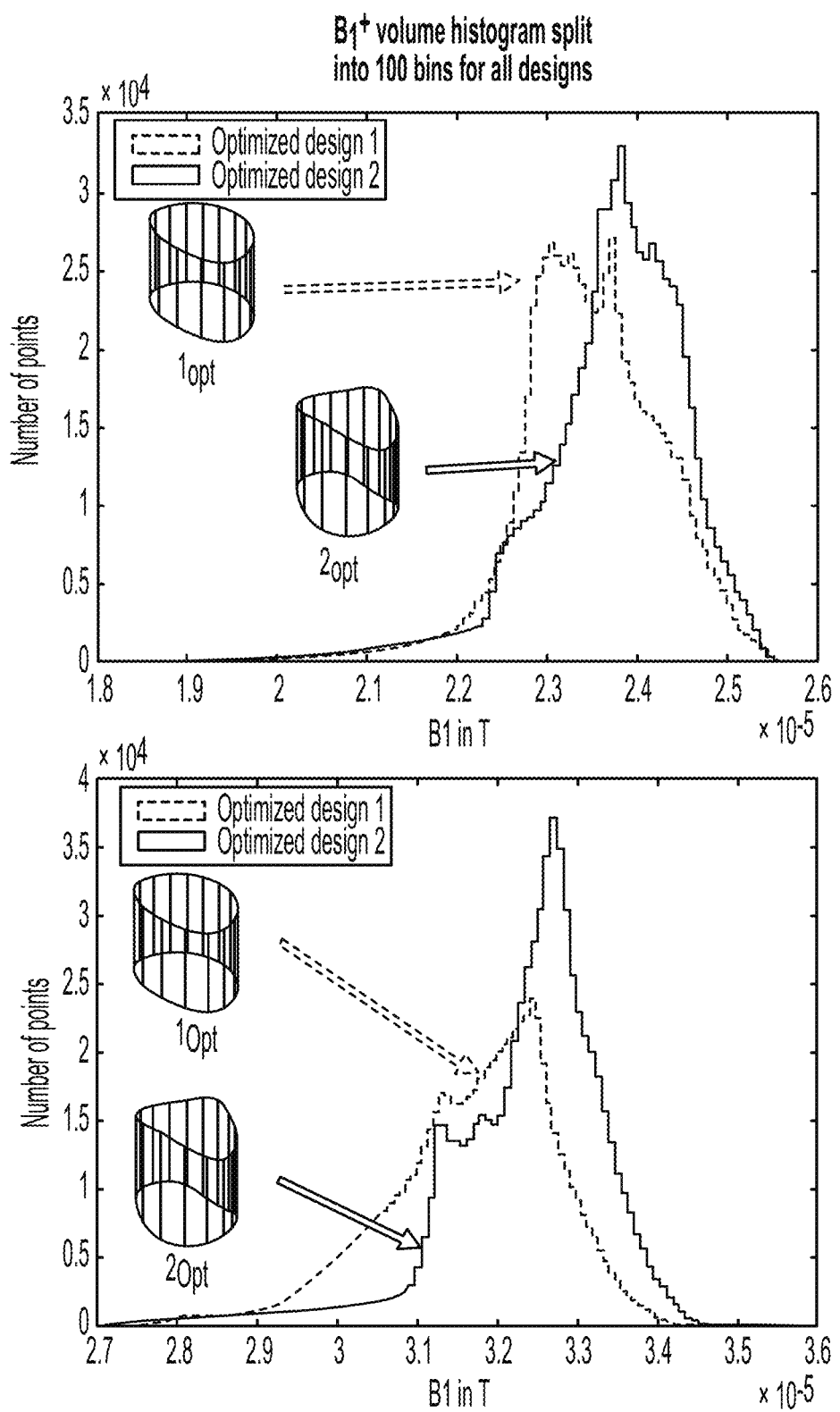
FIG. 19 shows the $B_1^+$ volume histogram split into 100 bins for the exemplary coils of FIG. 16 adjusted for the patient table.

FIG. 16 shows the field distribution for the central axial slice with the optimized design coils of FIG. 15 adjusted to the patient table. Both of the optimized birdcage designs of FIG. 16 adjusted to the patient table have a homogeneous $B_1^+$ axial slice profile. FIGS. 18 and 19 show the $B_1^+$ volume deviation with the coils of FIG. 16 adjusted to the patient table. Both of the optimized birdcage designs of FIG. 16 have a very homogeneous $B_1^+$ volume distribution. The shield size affected the efficiency.

Iterative movements of rung positions and decreasing the short axis of the top-half ellipse improved the $B_1^+$ homogeneity to 88% for the smallest and largest shield. Stretching the endings and maintaining equal areas of opposing rungs improved the homogeneity for the larger shield size, increasing to 93% inside the VOI. The mean $B_1^+$ increased by 0.2 µT-0.6 µT.

Analysis of the three common birdcage designs showed $B_1^+$ homogeneity and efficiency is strongly dependent on the position of the birdcage within the RF shield and the distance between the rungs and the shield. Optimization of the rungs' position and the coil dimensions homogenized the field distribution significantly under loaded condition. Furthermore, end-ring stretching improved the field homogeneity, approaching similar homogeneity for the desired target margin as on a traditional centered cylindrical birdcage, at the cost of efficiency and A-P dimensions. Data analysis of commonly used birdcage designs provided the insight in field pattern distribution under a loaded condition including dielectric effects. This resulted in optimizing rung spacing and end-ring shape for homogeneous $B_1^+$ excitation profiles across the entire thorax volume and ultimately identifying two potential designs for construction.

Based upon the above disclosure, it can be seen that improved homogeneity for such non-cylindrical birdcage coils may be provided by varying the capacitive elements and/or inductive elements of the LC delay circuit (with our without varying the spacing between the rungs) to provide a uniform rotational velocity of the magnetic field about a circumference of the birdcage coil in various alternate embodiments. In an embodiment, the varied capacitive elements and/or inductive elements are symmetrical between the left side and right side of the birdcage coil. Alternatively, or in addition, the varied capacitive/inductive elements involves varied inductive elements. For example, the varied inductive elements involves varied dimensions of the elongated rungs, such as, varied lengths of the elongated rungs and/or varied diameters of the elongated rungs. Various dimensions of the elongated rungs may be varied to accommodate/generate a certain inductance provided by the elongated rungs. In an embodiment, the spacing from center to center between rungs remains uniform about the circumference of the birdcage, but the dimensions of the rungs are varied (such as by varying the lengths of the rungs and/or the diameters of the rungs and/or by varying other sizes/shapes of the rungs).

Having described the inventions by reference to example embodiments, it will be obvious that modifications can be made to such embodiments without departing from the scope of the invention as claimed.

The following References are incorporated by reference:
1. Walkup L L, Woods J C. Translational applications of hyperpolarized $^3$He and $^{129}$Xe. NMR in Biomed Volume 27, Issue 12 Dec. 2014 Pages 1429-1438.
2. Stewart N J, Horn F C, Norquay G, et al. Reproducibility of Quantitative Indices of Lung Function and Microstructure from $^{129}$Xe Chemical Shift Saturation Recovery (CSSR) MR Spectroscopy. Magn Reson Med 77:6 (2017) 2107-2113.
3. Kaushik S S, Robertson S H, Freeman M S et al., Single-Breath Clinical Imaging of Hyperpolarized $^{129}$Xe in the Airspaces, Barrier, and Red Blood Cells Using an Interleaved 3D Radial 1-Point Dixon Acquisition. Magn Reson Med 75:4 (2016) 1424-1443.
4. Ruppert K, Altes T, Mata J F, et al., Detecting Pulmonary Capillary Blood Pulsations Using Hyperpolarized Xenon-129 Chemical Shift Saturation Recovery (CSSR) MR Spectroscopy. Magn Reson Med 75:4 (2016) 1771-1780.
5. Wetterling F, Corteville D M, Kalayciyan R, et al. Whole body sodium MRI at 3T using an asymmetric birdcage resonator and short echo time sequence: first images of a male volunteer. Phys. Med. Biol. 57 (2012) 4555-4567.
6. Zanche N D, Chhina N, Teh K, et al. Asymmetric Quadrature Split Birdcage Coil for Hyperpolarized $^3$He Lung MRI at 1.5T. Magn Reson Med 60:431-438 (2008).
7. Dregely I, Ruset I C, 2 Wiggins G, et al. 32-Channel Phased-Array Receive with Asymmetric Birdcage Transmit Coil for Hyperpolarized Xenon-129 Lung Imaging. Magn Reson Med 70:576-583 (2013).

What is claimed is:
1. A birdcage coil for a magnetic resonance imaging (MRI) system, the birdcage coil comprising:
   a pair of conductive end rings, each having a generally domed shape in axial cross section;
   a plurality of conductive, elongated rungs extending between the pair of conductive end rings in an axial direction; and
   an LC delay circuit incorporated into the pair of rings and the plurality of elongated rungs, the LC delay circuit comprising a plurality of capacitive elements and a plurality of inductive elements;

wherein circumferential spacing between adjacent elongated rungs is varied to improve homogeneity of a volume excitation.

2. The birdcage coil of claim 1, wherein a length of the elongated rungs is varied so that an area between adjacent elongated rungs is substantially the same.

3. The birdcage coil of claim 2, wherein one or both of the end rings are non-planar to account for the varied lengths of the elongated rungs.

4. The birdcage coil of claim 1, wherein the capacitive elements in the LC delay circuit are varied.

5. The birdcage coil of claim 4, wherein the capacitive elements in the LC delay circuit are varied to maintain a steady speed of delay about a circumference of the birdcage coil.

6. The birdcage coil of claim 1, wherein:
the generally domed shaped end rings have a generally flat bottom, a generally rounded top, a left side and a right side; and
the varied circumferential spacing between adjacent elongated rungs is symmetrical between the left side and right side.

7. The birdcage coil of claim 6, wherein the varied circumferential spacing is wider on a bottom half and closer on a top half.

8. The birdcage coil of claim 1, wherein:
the generally domed shaped end rings have a generally flat bottom, a generally rounded top, a left side and a right side; and
the varied circumferential spacing is wider approximate the bottom and closer approximate the top.

9. The birdcage coil of claim 1, wherein the birdcage coil is a high-pass birdcage coil.

10. The birdcage coil of claim 1, comprising sixteen of the conductive, elongated rungs extending between the pair of conductive end rings in an axial direction.

11. The birdcage coil of claim 1, wherein the birdcage coil is a low-pass birdcage coil.

12. The birdcage coil of claim 1, wherein the birdcage coil is a band-pass birdcage coil.

13. The birdcage coil of claim 1, wherein circuitry is added to dynamically detune the birdcage coil to prevent inductive coupling of the birdcage coil to one or more receive coils placed inside of the birdcage coil during MR signal reception.

14. A birdcage coil for a magnetic resonance imaging (MRI) system, the birdcage coil comprising:
a pair of conductive end rings, each having a generally domed shape in axial cross section;
a plurality of conductive, elongated rungs extending between the pair of conductive end rings in an axial direction; and
an LC delay circuit incorporated into the pair of rings and the plurality of elongated rungs, the LC delay circuit comprising a plurality of capacitive elements and a plurality of inductive elements;
wherein at least one of the capacitive elements or inductive elements is varied to provide a uniform rotational velocity of a magnetic field about a circumference of the birdcage coil.

15. The birdcage coil of claim 14, wherein:
the generally domed shaped end rings have a generally flat bottom, a generally rounded top, a left side and a right side; and
the varied at least one of capacitive elements or inductive elements is symmetrical between the left side and right side.

16. The birdcage coil of claim 14, wherein circuitry is added to dynamically detune the birdcage coil to prevent inductive coupling of the birdcage coil to one or more receive coils placed inside of the birdcage coil during MR signal reception.

17. The birdcage coil of claim 14, wherein the varied at least one of capacitive elements or inductive elements comprises varied inductive elements.

18. The birdcage coil of claim 17, wherein the varied inductive elements comprises varied dimensions of the elongated rungs.

19. The birdcage coil of claim 18, wherein the varied dimensions of the elongated rungs comprises varied lengths of the elongated rungs.

20. The birdcage coil of claim 19, wherein the varied dimensions of the elongated rungs comprises varied diameters of the elongated rungs.

21. A birdcage coil for a magnetic resonance imaging (MRI) system, the birdcage coil comprising:
a pair of conductive end rings, each having at least one asymmetric dimension in axial cross section;
a plurality of conductive, elongated rungs extending between the pair of conductive end rings in an axial direction; and
an LC delay circuit incorporated into the pair of rings and the plurality of elongated rungs, the LC delay circuit comprising a plurality of capacitive elements and a plurality of inductive elements;
wherein circumferential spacing between adjacent elongated rungs is varied to improve homogeneity of a volume excitation.

22. The birdcage coil of claim 21, wherein a length of the elongated rungs is varied so that an area between adjacent elongated rungs is substantially the same.

23. The birdcage coil of claim 22, wherein the pair of end rings are non-planar to account for the varied lengths of the elongated rungs.

24. The birdcage coil of claim 21, wherein the capacitive elements in the LC delay circuit are varied.

25. The birdcage coil of claim 24, wherein the capacitive elements in the LC delay circuit are varied to maintain a steady speed of delay about a circumference of the birdcage coil.

26. The birdcage coil of claim 21, wherein circuitry is added to dynamically detune the birdcage coil to prevent inductive coupling of the birdcage coil to one or more receive coils placed inside of the birdcage coil during MR signal reception.

* * * * *